United States Patent
Hyde et al.

(10) Patent No.: US 8,539,426 B2
(45) Date of Patent: Sep. 17, 2013

(54) METHOD AND SYSTEM FOR EXTRACTING COMPACT MODELS FOR CIRCUIT SIMULATION

(75) Inventors: Paul A. Hyde, Essex Junction, VT (US); Rainer Thoma, Essex Junction, VT (US); Josef S. Watts, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 145 days.

(21) Appl. No.: 13/031,693

(22) Filed: Feb. 22, 2011

(65) Prior Publication Data

US 2012/0212504 A1    Aug. 23, 2012

(51) Int. Cl.
| | |
|---|---|
| *G06F 17/50* | (2006.01) |
| *G01R 25/00* | (2006.01) |
| *G01R 27/00* | (2006.01) |
| G06F 17/10 | (2006.01) |
| G06F 17/15 | (2006.01) |

(52) U.S. Cl.
CPC ........ *G06F 17/5004* (2013.01); *G06F 17/5045* (2013.01); *G06F 17/10* (2013.01); *G06F 17/15* (2013.01); *G01R 25/00* (2013.01); *G01R 27/00* (2013.01)
USPC ............. 716/136; 716/54; 716/107; 716/111; 716/132; 716/52; 703/2; 703/16; 702/65; 702/66; 702/117; 702/124; 702/190

(58) Field of Classification Search
CPC ..... G06F 17/10; G06F 17/15; G06F 17/5004; G06F 17/5045; G01R 25/00; G01R 27/00
USPC .......... 716/52, 54, 107, 111, 132, 136; 703/2, 703/16; 702/65, 66, 117, 124, 190
See application file for complete search history.

(56) References Cited

U.S. PATENT DOCUMENTS

| | | | |
|---|---|---|---|
| 5,424,964 A * | 6/1995 | Machala et al. ............... 716/112 |
| 6,847,924 B1 * | 1/2005 | Aldridge et al. .................. 703/2 |
| 6,850,871 B1 * | 2/2005 | Barford et al. .................... 703/2 |
| 6,851,097 B2 | 2/2005 | Zhang et al. |
| 6,901,570 B2 | 5/2005 | Lu |
| 6,937,971 B1 | 8/2005 | Smith et al. |
| 7,016,747 B1 * | 3/2006 | Ninomiya ........................ 700/97 |
| 7,250,772 B2 * | 7/2007 | Furse et al. ................... 324/534 |
| 7,353,473 B2 | 4/2008 | Pino et al. |
| 7,447,614 B2 | 11/2008 | Ghaboussi et al. |
| 7,454,259 B2 * | 11/2008 | Ninomiya ........................ 700/98 |
| 7,492,934 B2 | 2/2009 | Mundy et al. |
| 7,584,080 B2 * | 9/2009 | Taylor et al. ....................... 703/2 |
| 7,600,212 B2 | 10/2009 | Zach et al. |
| 7,693,692 B2 * | 4/2010 | Fujinuma .......................... 703/2 |
| 8,082,534 B2 * | 12/2011 | Nozuyama .................... 716/136 |
| 8,121,820 B2 * | 2/2012 | Walch ............................... 703/1 |

(Continued)

FOREIGN PATENT DOCUMENTS

JP             06282633 A    * 10/1994

*Primary Examiner* — Phallaka Kik
(74) *Attorney, Agent, or Firm* — Anthony Canale; Roberts Mlotkowski Safran & Cole, P.C.

(57) ABSTRACT

A method of forming a compact model for an electrical device includes obtaining shape information for the device and obtaining nominal information for the device. The method also includes merging the shape information and the nominal information to form composite data, and fitting the compact model to the composite data.

23 Claims, 7 Drawing Sheets

(56) References Cited

U.S. PATENT DOCUMENTS

| | | |
|---|---|---|
| 8,126,682 B2 * | 2/2012 | Anami et al. .................. 703/1 |
| 2002/0099461 A1 * | 7/2002 | Anami et al. .................. 700/97 |
| 2004/0073879 A1 | 4/2004 | Chen et al. |
| 2004/0148579 A1 * | 7/2004 | Visweswariah ............... 716/2 |
| 2004/0168142 A1 * | 8/2004 | Ishikawa et al. .............. 716/10 |
| 2005/0027492 A1 * | 2/2005 | Taylor et al. .................. 703/2 |
| 2005/0049844 A1 * | 3/2005 | Wei et al. ...................... 703/14 |
| 2006/0100873 A1 | 5/2006 | Bittner et al. |
| 2007/0255537 A1 * | 11/2007 | Fujinuma ....................... 703/1 |
| 2008/0052654 A1 * | 2/2008 | Rahmat et al. ................ 716/6 |
| 2008/0275675 A1 | 11/2008 | Jones et al. |
| 2009/0306953 A1 * | 12/2009 | Liu et al. ....................... 703/14 |
| 2009/0327981 A1 | 12/2009 | Nakamura et al. |
| 2010/0122222 A1 * | 5/2010 | Elfadel et al. ................. 716/4 |
| 2010/0169849 A1 | 7/2010 | Trombley et al. |
| 2011/0295575 A1 * | 12/2011 | Levine et al. .................. 703/2 |
| 2012/0059613 A1 * | 3/2012 | Utter et al. .................... 702/70 |
| 2012/0078533 A1 * | 3/2012 | Nouvelle ....................... 702/27 |
| 2012/0096412 A1 * | 4/2012 | Fujimura et al. .............. 716/53 |
| 2012/0173174 A1 * | 7/2012 | Gaarder ......................... 702/58 |
| 2012/0210283 A1 * | 8/2012 | Li et al. ......................... 716/112 |

\* cited by examiner

METHOD AND SYSTEM FOR EXTRACTING COMPACT MODELS FOR CIRCUIT SIMULATION

FIELD OF THE INVENTION

The invention relates to integrated circuit (IC) modeling and, more particularly, to a method and system for extracting compact models for circuit simulation.

BACKGROUND

Circuit simulation is used in integrated circuit design to predict how a circuit behaves prior to the circuit being physically implemented, e.g., fabricated. Circuit simulators, such as SPICE, rely on mathematical compact models of circuit elements to perform such simulations. A model is typically a set of equations and a set of parameters for the equations that predict the current and charges at terminals of a device as a function of the voltages at the terminals. The model is fit to characteristics of a particular process in which some of the characteristics are represented by sample devices and some of the characteristics are different from available hardware. Such models are normally built while the process is still under development.

Current practice is to first fit a model to the available hardware, and then adjust the model to match target currents and/or threshold voltages at specific conditions while minimizing distortion of the model. This process is time consuming because it involves two model fittings and construction of a set of target currents which are self consistent is difficult. For example, each model fitting involves an optimization process in which the equations and/or parameters are iteratively adjusted to meet the hardware measurements (e.g., in a first model fitting) and the target values (e.g., in a second model fitting).

Accordingly, there exists a need in the art to overcome the deficiencies and limitations described hereinabove.

SUMMARY

In a first aspect of the invention, there is a method of forming a compact model for an electrical device. The method comprises obtaining shape information for the device and obtaining nominal information for the device. The method also comprises merging the shape information and the nominal information to form composite data, and fitting the compact model to the composite data. The merging may be performed using a processor.

In another aspect of the invention, there is a system for forming a compact model for an electrical device. The system comprises a computer device comprising a processor configured to execute at least one application operable to: obtain shape information comprising measured data; obtain nominal information comprising targets; merge the shape information and the nominal information to create composite data that meets the targets; and fit the compact model to the composite data.

In another aspect of the invention, a computer program product includes a computer usable storage medium having readable program code embodied in the medium. The computer program product includes at least one component operable to: merge shape information and nominal information to create composite data that meets a plurality of targets. The shape information comprises measured data comprising a data set of data points of measured electrical parameters. The plurality of targets comprises voltages and currents at pre- defined conditions. The merging comprises applying a series of transformations to each data point in the data set to adjust values of the data points to create the composite data that meets the targets.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
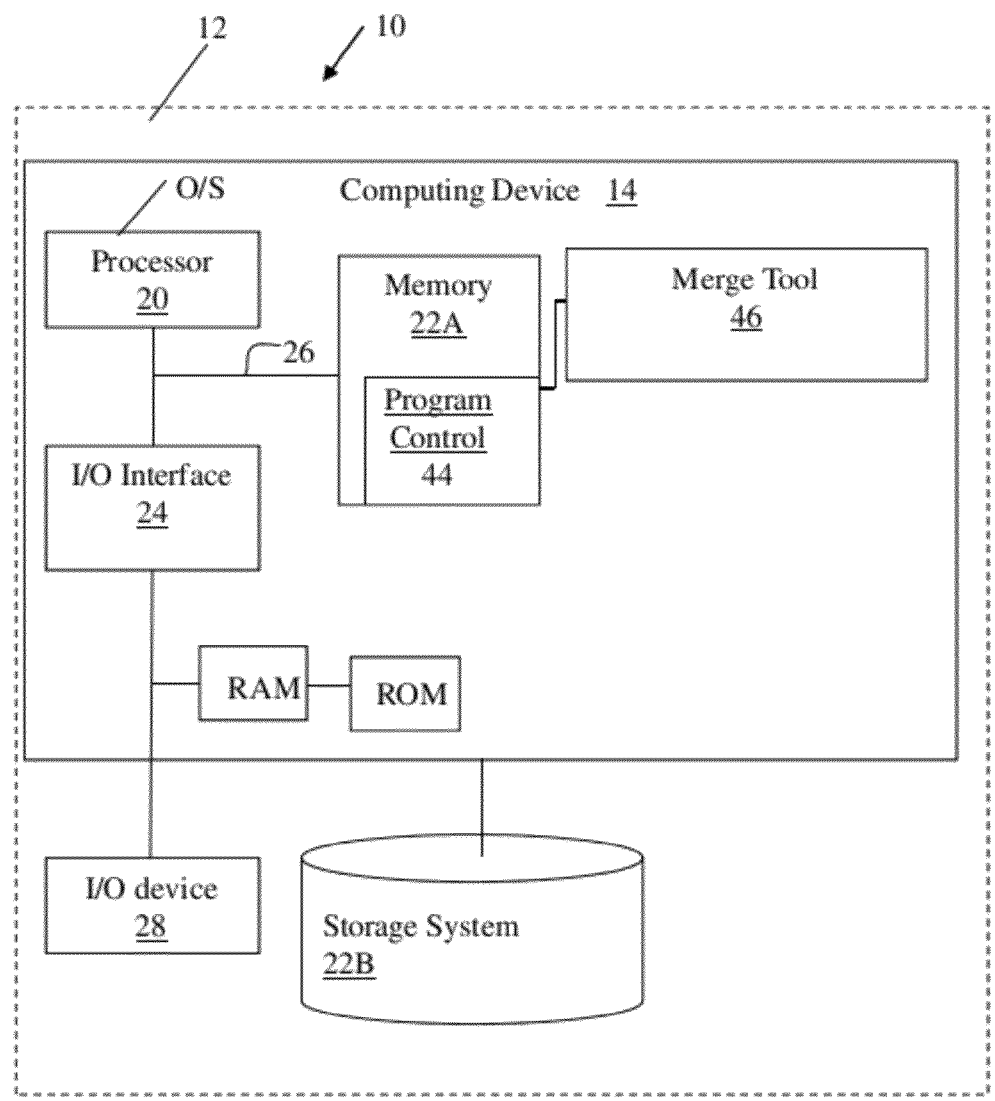
FIG. 1 shows an illustrative environment for implementing the steps in accordance with aspects of the invention.

The invention relates to IC modeling and, more particularly, to a method and system for extracting models for circuit simulation. In accordance with aspects of the invention, shape information and nominal information of an integrated circuit device is merged into composite data by applying mathematical transformations to measured data prior to model extraction. In embodiments, the transformations are applied in a sequence that adjusts the measured data to meet target values while also preserving the initial shape and relative spacing between respective curves of the measured data. The composite data (e.g., the adjusted measured data) may then be used as a basis for model extraction for a circuit simulator by performing a single model fitting process, rather than two separate model fitting processes. By adjusting the measured data to fit the targets and maintain its shape, implementations of the invention provide methods and systems for model extraction that eliminate a time-consuming model fitting step. In this manner, implementations of the invention eliminate further on the centering step (e.g., in the model extraction process) as an under-constrained problem and replace it by an over-constrained problem, equivalent to working with measured data. This approach improves both the robustness and accuracy of final models, since a larger set of model parameters may be used.

System Environment

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 shows an illustrative environment 10 for managing the processes in accordance with the invention. To this extent, the environment 10 includes a server or other computing system 12 that can perform the processes described herein. In particular, the server 12 includes a computing device 14. The computing device 14 can be resident on a network infrastructure or computing device of a third party service provider (any of which is generally represented in FIG. 1).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with the external I/O device/resource 28 and the storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard etc.

In general, the processor 20 executes computer program code (e.g., program control 44), which can be stored in the memory 22A and/or storage system 22B. Moreover, in accordance with aspects of the invention, the program control 44 controls a merge tool 46 that performs one or more of the processes described herein, e.g., merging shape information and nominal information of an integrated circuit device to generate composite information to which a compact model may be fit. The merge tool 46 can be implemented as one or more program code in the program control 44 stored in memory 22A as separate or combined modules. Additionally, the merge tool 46 may be implemented as separate dedicated processors or a single or several processors to provide the function of these tools. While executing the computer program code, the processor 20 can read and/or write data to/from memory 22A, storage system 22B, and/or I/O interface 24. The program code executes the processes of the invention. The bus 26 provides a communications link between each of the components in the computing device 14.

The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the process described herein. Further, while performing the processes described herein, one or more computing devices on the server 12 can communicate with one or more other computing devices external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 2A:
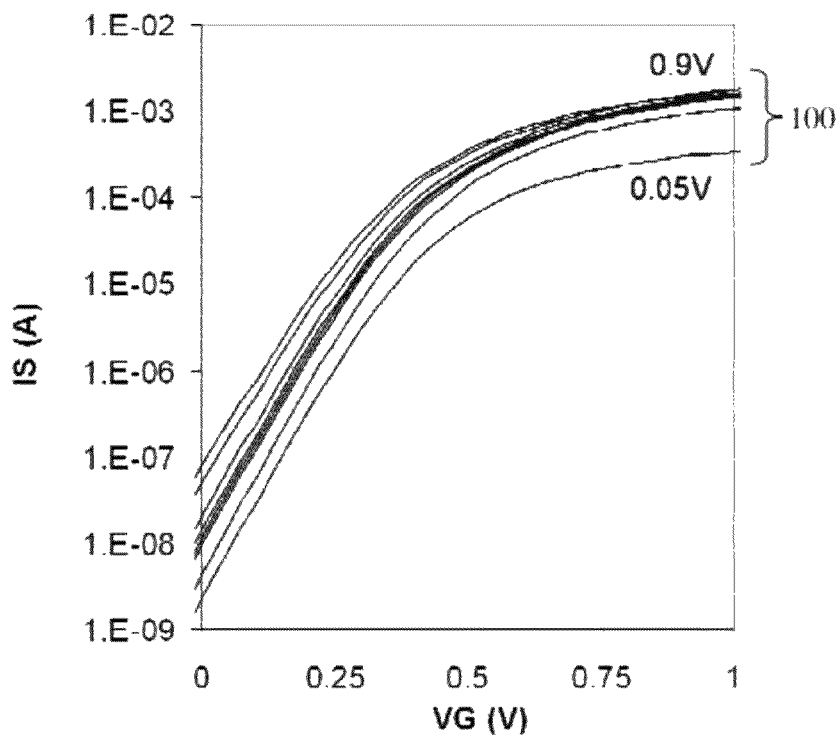
FIGS. 2A-2C, 3A-3C, and 4A-4B show plots of data associated with aspects of the invention.
Figure 2B:
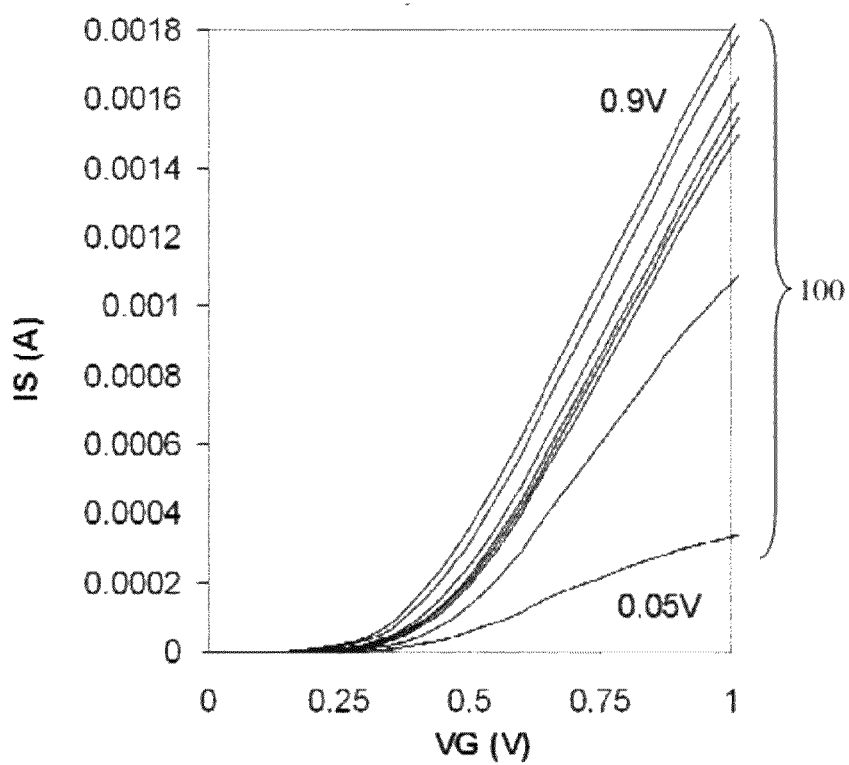

FIGS. 2A-2C, 3A-3C, and 4A-4B show plots of data associated with aspects of the invention. In particular, FIG. 2A shows a graph of multiple curves 100 corresponding to transfer characteristics of a device, e.g., a transistor. The x-axis represents gate voltage (VG), e.g., the bias condition of voltage applied to the gate of the transistor. The y-axis represents the measured source current (IS), e.g., the measured condition of current measured at the source of the transistor. The y-axis in FIG. 2A has a logarithmic scale. Each one of the curves 100 represents a different bias applied to the drain of the transistor. FIG. 2B shows the same data as FIG. 2A, except that the y-axis in FIG. 2B has a linear scale. Each individual curve of the pluralities of curves 100 comprises a plurality of data points (e.g., measured data) in the form of an ordered pair (VG, IS). The data points may be measured in any suitable known or later developed manner of testing IC chips, e.g., probes, hardware test equipment, etc. For example, the data points may be obtained by applying voltages to one or more terminals of a hardware transistor and measuring the current and/or voltage at one or more terminals of the transistor.

Figure 2C:
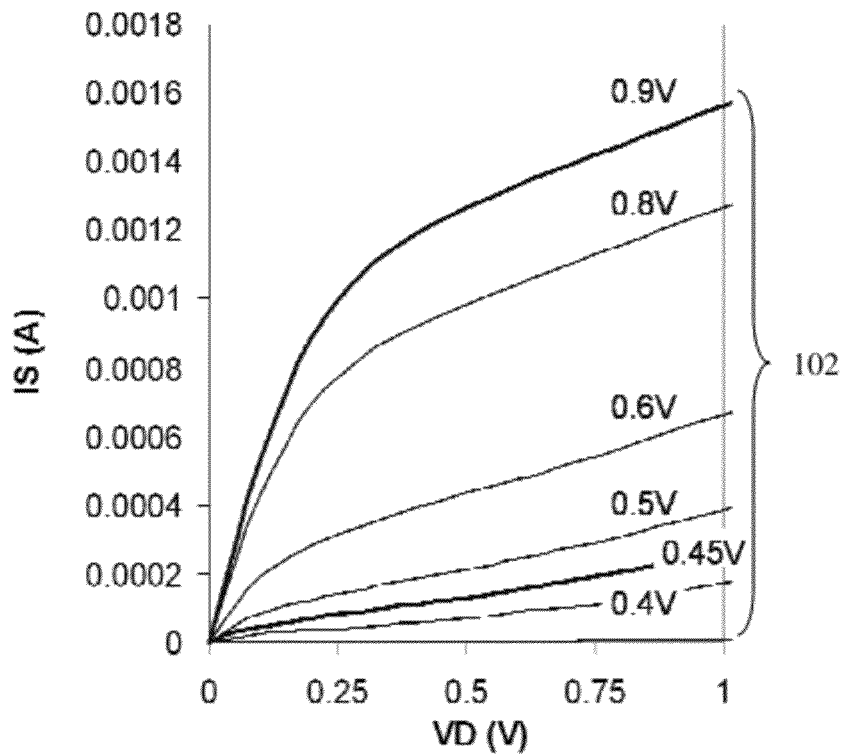

FIG. 2C shows a graph of multiple curves 102 corresponding to output characteristics of the same device, e.g., transistor, as FIGS. 2A and 2B. The x-axis represents drain voltage (VD), e.g., voltage applied to the drain of the transistor. The y-axis represents the measured source current (IS), e.g., the current measured at the source of the transistor. Each one of the curves 102 represents a different bias applied to the gate of the transistor. Each one of the curves 102 comprises a plurality of data points (e.g., measured data) in the form of an ordered pair (VD, IS). The measured data may be measured in a manner similar to that described above with respect to FIGS. 2A and 2B.

The data shown in FIGS. 2A-2C is illustrative of the many different types of measured data that may be obtained for later use in extracting a model. The totality of the measured data is referred to as data set. The measured data contains shape information in the sense that it defines a plurality of curves have particular shapes and relative spacing between the curves. Thus, as used herein, shape information refers to information or data that defines the shape of one or more measured electrical responses of a device, and may also refer to the relative spacing between such electrical responses. In embodiments, obtaining the shape information for the device comprises measuring a shape of an electrical response of the device. The measuring the shape of the electrical response of the device may comprise, for example, applying a series of biases to device terminals and measuring current at one or more of the terminals. The measured data may comprise other hardware measurements, such as source current versus gate voltage, drain current versus gate voltage, drain current versus drain voltage for the device, and RF scattering parameters measured while applying a series of DC biases with an RF signal superimposed. Also, measured data may be obtained for different devices, such as transistors with different channel lengths (e.g., 45 nm, 32 nm, etc.), transistors with different doping type (e.g., p-type and n-type), and transistors formed in different substrates (e.g., silicon on insulator, bulk substrate, etc.).

Figure 3A:
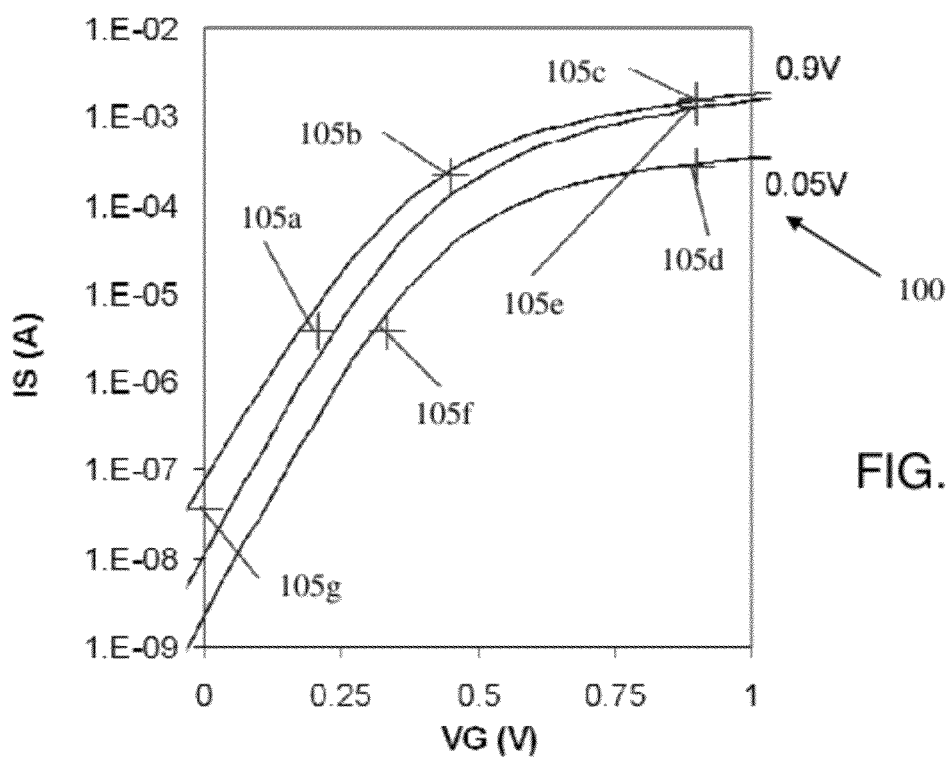
Figure 3B:
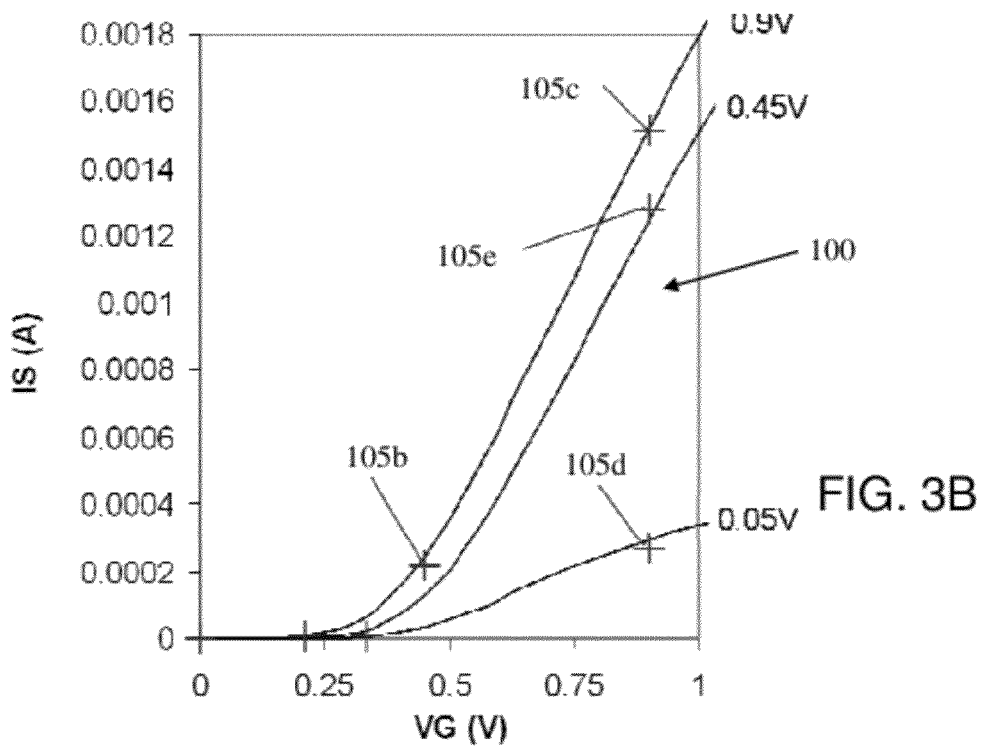
Figure 3C:
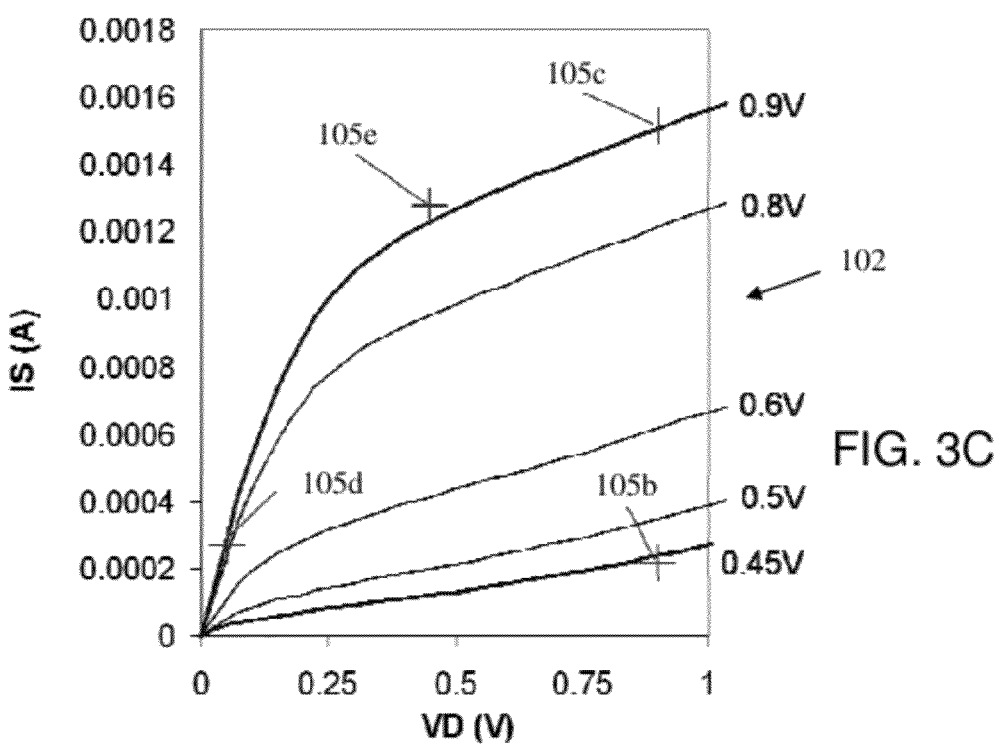

FIG. 3A shows a subset of the curves 100 with targets 105a-g superimposed on the graph. The targets 105a-g are a desired output for the device, and represent nominal information of the model. The targets 105a-g may be determined in any suitable manner, such as set by an IC chip manufacturer, extrapolated from a previous technology using historical trends, calculated by finite element based simulation of a proposed manufacturing process, derived statistically from data from many lots of hardware from a factory, etc. The targets 105a-g may comprise numerical values of measurable parameters at specified conditions, such as, for example: saturated threshold voltage (VTSAT) 105a; low current (ILOW) 105b; saturated current (IDSAT) 105c; linear current (IDLIN) 105d; high current (IHIGH) 105e; linear threshold voltage (VTLIN) 105f; and off current (IOFF) 105g. The invention is not limited to these targets, however, and any desired targets may be used within the scope of the invention, including calculated RF parameters such as FT (e.g., unity current gain cut-off frequency), FMAX (e.g., maximum oscillation frequency), gain, etc. FIG. 3B shows a subset of the curves 100 with targets 105b-e, and FIG. 3C shows a subset of curves 102 with targets 105b-e.

In accordance with aspects of the invention, the values of the data points (e.g., ordered pairs of the measured data) that make up the output characteristics of the device (e.g., curves 100 and 102) are adjusted to obtain composite data that meets the targets for the device (e.g., targets 105a-g). In embodiments, the adjustment is performed by applying one or more mathematical transformations to the all of the data points of all of the measured data (e.g., all of the data points in the data set). In implementations, the content of the transformations and the sequence in which transformations are applied are selected such that particular curves (e.g., curves 100 and 102) travel through particular targets (e.g., targets 105a-c), and also so that the initial shape and relative spacing between individual curves (e.g., as depicted in FIGS. 2A-2C) is maintained. As used herein, meeting a target refers to the value of a particular data point corresponding to a particular target being adjusted to within about 2.0 mV to 4.0 mV of the target value for threshold voltage targets (e.g., VTSAT, VTLIN, etc.) and to within about 0.5% to 1.5% of the target value for current targets (e.g., IOFF, IHIGH, ILOW, IDSAT, IDLIN, etc.), although other tolerances may be used within the scope of the invention.

Figure 4A:
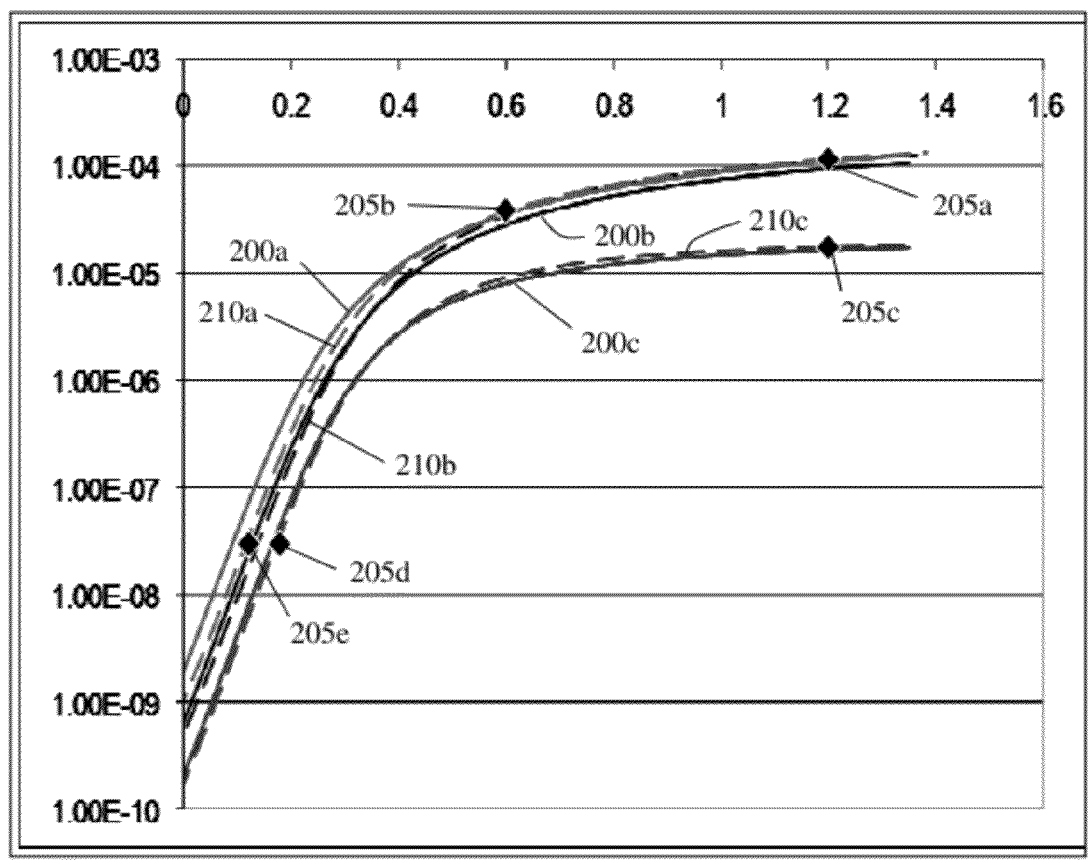
Figure 4B:
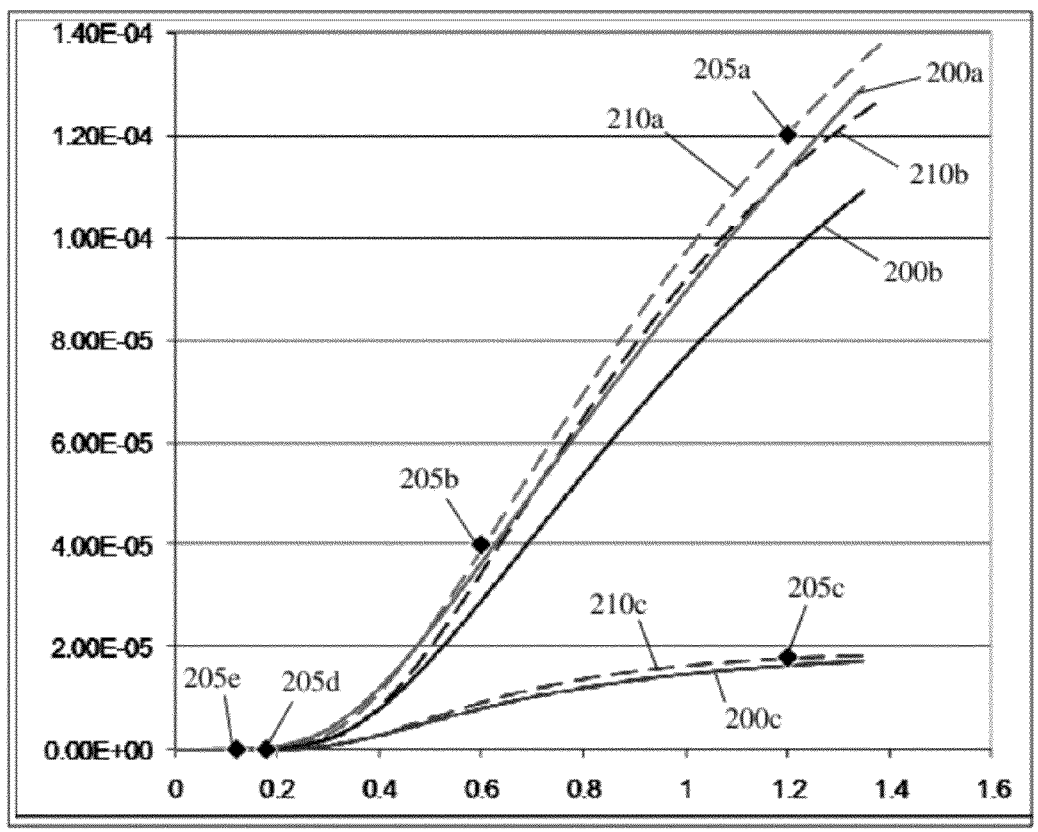

FIGS. 4A and 4B show graphs containing curves corresponding to measured data, targets, and composite data corresponding to adjusted data in accordance with aspects of the invention. In particular, FIG. 4A shows three curves 200a-c of measured data. The x-axis in FIG. 4A represents gate voltage (VG) of the device and the y-axis represents drain current (ID). The curves 200a-c are similar to curves 100 described above in that they represent shape information of the model and comprise a plurality of ordered pairs (VG, ID), e.g., data points corresponding to measurements taken from a hardware device. Curve 200a corresponds to a drain voltage (VD) of 1.0

V, curve 200*b* corresponds to a VD of 0.5 V, and curve 200*c* corresponds to a VD of 0.05 V.

FIG. 4A also shows targets 205*a-e*, which represent nominal information of the model and are similar to targets 105*a-g* described above with respect to FIGS. 3A-3C. FIG. 4B shows the same data as FIG. 4A, except that in FIG. 4B the y-axis has a linear scale and in FIG. 4A the y-axis has a logarithmic scale.

FIG. 4A additionally shows adjusted curves 210*a-c* that represent adjusted data (also referred to as composite data) in accordance with aspects of the invention. For example, adjusted curve 210*a* results from changing the values of VG and ID for each data point, e.g., ordered pair (VG, ID), of curve 200*a* according to predefined mathematical transformations. Similarly, adjusted curve 210*b* is the result of changing the values of VG and ID for each data point of curve 200*b*, and adjusted curve 210*c* is the result of changing the values of VG and ID for each data point of curve 200*c*, using the same mathematical transformations as applied to the data of curve 200*a*.

In embodiments, the transformations are configured to cause adjusted curve 210*a* to meet targets 205*a* and 205*b* (e.g., to have a value within a predefined tolerance of the target value), to cause adjusted curve 210*b* to meet target 205*e*, and to cause adjusted curve 210*c* to meet targets 205*c* and 205*d*. The transformations are also configured such that adjusted curves 210*a-c* retain substantially the same shape and relative spacing as curves 200*a-c*. This is referred to herein as merging the shape information and the nominal information. In implementations, the transformations and the sequence of applying the transformations may be empirically determined based on, for example, the targets being used in the model (e.g., VTSAT, VTLIN, IOFF, THIGH, ILOW, IDSAT, IDLIN, etc.), the measured data (e.g., ID, IS, VG, VD, etc.), and parameters of the device being modeled (e.g., PFET, NFET, SOI, bulk, FinFET, etc.). Different transformations may be determined and applied to different devices to produce the adjusted data. Examples of transformations are described in greater detail herein.

Flow Diagram

Figure 5:
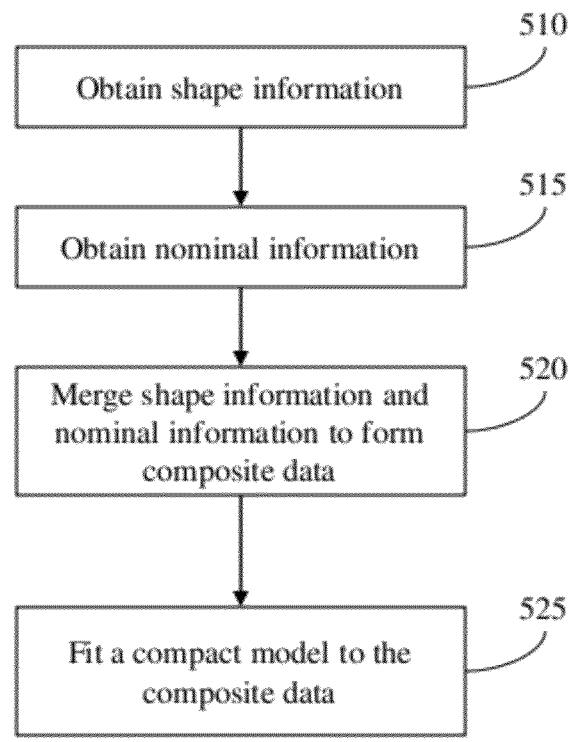
FIG. 5 shows a flow diagram of a process in accordance with aspects of the invention.

FIG. 5 shows an exemplary flow for performing aspects of the present invention. The steps of FIG. 5 may be implemented in the environment of FIG. 1, for example.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environment of FIG. 1. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

FIG. 5 depicts an exemplary flow for a process in accordance with aspects of the present invention. At step 510, shape information is obtained by measuring parameters of the modeling hardware. In embodiments, the shape information comprises measured data similar to curves 100 in FIG. 2A and curves 200*a-c* in FIG. 4A, and may be obtained using conventional measuring processes, e.g., hardware testing equipment, etc. For example, step 510 may comprise obtaining electrical measurements of device parameters from a physical device (e.g., FET).

At step 515, nominal information is obtained by deriving targets for the model. The targets are similar to targets 105*a-g* and 205*a-e* described above. The targets may be obtained in a conventional manner, such as deriving targets from a larger hardware sample and intended device changes. For example, the targets may be set by an IC chip manufacturer, extrapolated from a previous technology using historical trends, calculated by finite element based simulation of a proposed manufacturing process, derived statistically from data from many lots of hardware from a factory, etc. The targets are expressed as numerical characteristics and represent features of the device to be captured in the model.

At step 520, the shape information from step 510 and the nominal information from step 515 are merged by applying a continuous transformation to the measured data. In embodiments, step 520 is performed using the merge tool 46 (e.g., as described above with respect to FIG. 1) and in a similar manner as described above with respect to FIGS. 4A and 4B. For example, the merge tool 46 may be programmed to compare the measured data to the targets and apply a set of one or more transformations to each data point of the measured data to obtain composite data (e.g., adjusted data) that is coincident with the targets (e.g., meets the targets). In embodiments, the adjusting the measured data involves applying a series of transformations that apply a mathematical formula to the data points to change the value of either the bias condition or the measured current of every data point in the measured data set, with the series of transformations being applied in a specific order to achieve the desired set of characteristics.

At step 525, a compact model is fit to the composite data. In embodiments, the model is fit to the composite data in a conventional manner, such as using commercial software tools to produce a set of equations and parameters that reproduce the composite data. The model may be input into a simulation tool, such as SPICE, and used for circuit simulation in circuit design.

In accordance with aspects of the invention, the merging of the shape information and the nominal information at step 520 differs from a conventional model fitting process because the merging at step 520 involves adjusting the measured data (e.g., using the transformations) rather than generating sets of equations and parameters to numerically model the measured data. Accordingly, the merging of the shape information and nominal information at step 520 makes it possible to construct the compact model with a single model fitting process at step 525, as opposed to two or more model fitting processes.

Example 1

A first exemplary process for merging the shape information and the nominal information in accordance with aspects of the invention is described below. The described transformations and sequence of applying the transformations are illustrative, and are not intended to limit the scope of the invention.

In this example, after the hardware measurements have been obtained (e.g., step 510) and the targets have been derived (e.g., step 515), the measured data is compared to the targets to quantitatively determine differences between the measured data and the targets. In this example, comparing the measured data to the targets determines that the measured data: (i) should be changed by +30 mV to meet the VTLIN target; (ii) should be changed by +10 mV to meet the drain induced barrier lowering (DIBL) target; (iii) does not require any change to meet the linear current (IDLIN) target; and (iv) should be changed by −3% to meet the saturated current (IDSAT) target.

The first transformation involves adjusting the value of VG (gate bias) in each data point of the data set in order to meet the VTLIN target. In particular, the first transformation is given by:

$$VG' = VG - 0.030V$$

where VG is the value of VG in a data point of the measured data and VG' is the new value of VG for that data point after the transformation. This transformation is applied to every data point prior to moving to the next transformation. The second transformation involves further adjusting the already adjusted value of VG in each data point of the data set to meet the DIBL target. In particular, the second transformation is given by:

$$VG'' = VG' + 0.010*((VD - 0.05)/(VDD - 0.05))$$

where VG" is the new value of VG for the data point, VD is the bias applied to the drain, and VDD is the operation voltage of the device.

The third transformation involves adjusting the value of ID in each data point of the data set to meet the IDLIN target. Although the IDLIN target was initially met by the measured data, the adjustments performed in the first two transformations may shift the adjusted data away from the IDLIN target such that the adjusted data no longer meets the IDLIN target. For this reason, the third transformation is given by:

$$ID' = ID * X1$$

where ID is the measured value of ID in the data point, ID' is the adjusted value of ID for the data point, and X1 is the ratio of (a) the target value of IDLIN and (b) the adjusted measured data at the defined bias condition for IDLIN after the second transformation.

The fourth transformation involves further adjusting the value of ID in each data point of the data set to meet the IDSAT target. The fourth transformation is given by:

$$ID'' = ID'*X2((VD - 0.05)/(VDD - 0.05))$$

where ID" is the new value of ID for the data point, and X2 is 0.97 times the ratio of (a) the target value of IDSAT and (b) the adjusted measured data at the IDSAT bias conditions.

In embodiments, the first transformation is applied to every data point in the initial data set (e.g., every data point of the measured data) to obtain adjusted data. Then the second transformation is applied to every data point in the adjusted data to obtain twice adjusted data. Subsequently, the third transformation is applied to every data point in the twice adjusted data to obtain thrice adjusted data. Lastly, the fourth transformation is applied to every data point in the thrice adjusted data to obtain the composite data. The composite data captures both the shape information and the nominal information, and a model may be fit to the composite data.

Example 2

A second exemplary process for adjusting data in accordance with aspects of the invention is described below. The described transformations and sequence of applying the transformations are illustrative, and are not intended to limit the scope of the invention.

In this example, the targets are defined by the set of rules in Table 1. These rules are defined in accordance with the particular device being modeled.

TABLE 1

| |
| --- |
| VTLIN = VT @ VD = 0.05 V |
| VTSAT = VT @ VD = VDD |
| IOFF = IS @ VG = 0, VD = VDD |
| IDLIN = ID @ VG = VDD, VD = 0.05 V |
| IEFF = (IHI + ILO)/2 |
| IHI = ID @ VG = VDD, VD = VDD/2 |
| ILO = ID @ VG = VDD/2, VD = VDD |
| ION = ID @ VG = VDD, VD = VDD |

For example, Table 1 defines the VTLIN target as VTLIN equals the threshold voltage (VT) when the drain of the transistor is biased to 0.05 volts. Also in Table 1, IS refers to the current at the source of the transistor, ID refers to the current at the drain of the transistor, VG is the bias applied to the gate of the transistor, VDD is the operational voltage of the transistor, and ION is the saturated current target equivalent to IDSAT.

This example comprises seven transformations applied in the order of matching the data to the following targets: VTLIN, VTSAT, IDLIN, IHI, ION, ILO, and IOFF. The first transformation involves adjusting the measured data to match the VTLIN target. Similar to Example 1, the first transformation comprises adjusting the data to match VTLIN. This is done by adjusting the value of ID or IS for each data point based upon an interpolation of the measured data. The interpolation finds the value of the current when the voltage is shift by an amount equal to VTLIN target minus the measured VTLIN. In embodiments, the interpolation is linear below a first value, logarithmic above a second value, and an average of linear and logarithmic interpolations between the first and second values. In particular, the interpolation adjustment of the first transformation is given by:

$$I' = I_{LIN} \text{ when } x \leq 0,$$

$$I' = x*I_{LOG} + (1-x)*I_{LIN} \text{ when } -1 < x < 1,$$

$$I' = I_{LOG} \text{ when } x \geq 1, \text{ and}$$

$$x = (VTLIN - VG)/0.043$$

where I' is the adjusted value of either ID or IS for the data point, VG is from the measured data, $I_{LIN}$ is a linear interpolation function along the VG values, and $I_{LOG}$ is a logarithmic interpolation function along the VG values. This first transformation is applied to all of the data points to obtain adjust values of ID, and IS. After having performed this first transformation, the adjusted data meets the VTLIN target.

The second transformation involves adjusting all of the data for a VT shift proportional to VD minus 0.05 volts in order to satisfy the VTSAT target without disrupting the VTLIN target. In embodiments, this is accomplished by repeating the interpolation step from the first transformation for VTSAT instead of VTLIN, and by using (delta VT)=(delta VTSAT)*(VD−0.05)/(VDD−0.05). The adjusted data meets the VTLIN and the VTSAT targets after performing the second transformation.

The third transformation involves adjusting the data to match the IDLIN target. In embodiments, the ID value of each data point is multiplied by the ratio of (a) the value of the IDLIN target to (b) the value of the difference between the adjusted data and the IDLIN target.

The fourth transformation involves adjusting the data to match the IHI target. The fourth transformation is given by:

$$ID' = ID \cdot \left(1 + (RHI - 1) * \frac{VDSEFF - .05}{VD2 - .05}\right),$$
$$VDSEFF = \text{MIN}(VD, VDSAT)$$

where ID' is the new value of ID, RHI is the ratio of (a) the value of the IDHI target to (b) the adjusted data at the IDHI target bias conditions, and VDSAT=MAX(VG−VT,0.05). However, not all data points have a value of VT. For data points that do not have a VT value, the following expressions may be used to approximate a VT value:

$$VT = \frac{(.05)^2}{VD} + A \cdot VD + B$$
$$A = \frac{(VTLIN - .05) - \left(VTSAT - \frac{(0.05)^2}{VDD}\right)}{(VDD - 0.05)}$$
$$B = (VTLIN - 0.05) - A \cdot VTLIN$$

The fifth transformation involves adjusting the data to match the ION target. In embodiments, the ION target lies on the same curve as the IDHI target. The data was adjusted to meet the IDHI target in the fourth transformation. Accordingly, the ION target may be met by adjusting the slope of the curve of the adjusted data using the following expressions:

$$\Delta I = \Delta ION\left(\frac{2 \cdot VD}{VDD} - 1\right) \text{ for } VD > \frac{VDD}{2}$$
$$\Delta I = \Delta ION\left(\frac{2 \cdot VD}{VDD} - 1\right)\left(\frac{2 \cdot VD - 0.1}{VDD - 0.1}\right)^2 \text{ for } VD < \frac{VDD}{2}$$

where ΔION is the difference between the target value of ION and the adjusted data value corresponding to the ION target, and the value of ID in a data point is changed by ΔI.

The sixth transformation involves adjusting the data to match the ILO target. In embodiments, the ILO target is associated with a curve having a lower gate bias. The sixth transformation may comprise adjusting the ID value of each data point in a manner similar to the fourth transformation, the difference being that the multiplicative function of the sixth transformation is based on VG rather than VD. The correction in the sixth transformation is scaled by VD−0.05 so that the adjustment is zero for VD=0.05.

The seventh transformation involves adjusting the data to match the IOFF target. In embodiments, the seventh transformation is given by the expression:

$$M(VG) = \exp\left(\ln(ROFF)\frac{(VT - VG)}{VT}\right) \text{ for } VG < VT$$

where M(VG) is a multiplier that is used to adjust the value of ID in each data point, and ROFF is the ratio of (a) the target value of IOFF and (b) the value of the adjusted data corresponding to IOFF.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method of forming a compact model for an electrical device, comprising:
    obtaining shape information for the device;
    obtaining nominal information for the device;
    merging the shape information and the nominal information to form composite data, wherein the merging is performed using a processor; and
    fitting the compact model to the composite data.

2. The method of claim 1, wherein the obtaining the shape information for the device comprises measuring a shape of an electrical response of the device.

3. The method of claim 2, wherein the measuring the shape of the electrical response of the device comprises applying a series of biases to device terminals and measuring current at one or more of the device terminals.

4. The method of claim 2, wherein the measuring the shape of the electrical response of the device comprises applying a series of DC biases with an RF signal superimposed and measuring RF scattering parameters.

5. The method of claim 1, wherein the obtaining the nominal information for the device comprises deriving targets for device parameters.

6. The method of claim 5, wherein the targets are at least one of: predefined, extrapolated from a previous technology using historical trends, calculated by finite element based simulation of a proposed manufacturing process, and derived statistically from data from many lots of hardware from a factory.

7. The method of claim 5, wherein the targets comprise numerical values of the device parameters at predefined conditions.

8. The method of claim 7, wherein the device parameters comprise voltage and current.

9. The method of claim 7 wherein the device parameters comprise calculated RF parameters including at least one of: FT, FMAX, and gain.

10. The method of claim 7, wherein the composite data meets the targets within a predefined tolerance.

11. The method of claim 1, wherein the merging comprises applying at least one transformation to measured data.

12. The method of claim 1, wherein the merging comprises applying a continuous transformation to measured data.

13. The method of claim 1, wherein the fitting the compact model comprises generating a set of equations and parameters that define curves that fit the composite data.

14. The method of claim 1, wherein:
the obtaining the shape information for the device comprises obtaining measured data comprising a data set of data points of measured electrical parameters;
the obtaining the nominal information for the device comprises deriving targets; and
the merging comprises applying a series of transformations to each data point in the data set to adjust values of the data points such that the composite data satisfies the targets.

15. The method of claim 14, wherein:
the data set defines a plurality of curves having an initial shape and spacing; and
the applying the series of transformations substantially maintains the initial shape and spacing of the curves.

16. The method of claim 14, wherein the applying the series of transformations comprises:
applying a first transformation to all of the data points to produce adjusted data points; and
applying at least one subsequent transformation to all of the adjusted data points to produce the composite data.

17. The method of claim 1, wherein the shape information comprises measured data that defines a shape of a plurality of curves based on electrical responses of the device, and also defines a relative spacing between ones of the plurality of curves.

18. A system for forming a compact model for an electrical device, comprising:
a computer device comprising a processor configured to execute at least one application operable to:
obtain shape information comprising measured data;
obtain nominal information comprising targets;
merge the shape information and the nominal information to create composite data that meets the targets; and
fit the compact model to the composite data.

19. The system of claim 18, wherein:
the measured data comprises a data set of data points of measured electrical parameters;
the targets comprise voltages and currents at predefined conditions; and
the merging comprises applying a series of transformations to each data point in the data set to adjust values of the data points to create the composite data that meets the targets.

20. The system of claim 19, wherein:
the data set defines a plurality of curves having an initial shape and spacing; and
the applying the series of transformations substantially maintains the initial shape and spacing of the curves.

21. A computer program product comprising a computer usable storage device having readable program code embodied in the storage device, the computer program product includes at least one component that when executed by a computer causes the computer to:
merge shape information and nominal information to create composite data that meets a plurality of targets, wherein the shape information comprises measured data comprising a data set of data points of measured electrical parameters;
the plurality of targets comprises voltages and currents at predefined conditions; and
the merging comprises applying a series of transformations to each data point in the data set to adjust values of the data points to create the composite data that meets the targets.

22. The computer program product of claim 21, wherein:
the data set defines a plurality of curves having an initial shape and spacing; and
the applying the series of transformations substantially maintains the initial shape and spacing of the curves.

23. The computer program product of claim 21, further comprising at least one component to create a compact model for an electrical device by fitting the compact model to the composite data.

* * * * *